United States Patent [19]
Phillips

[11] Patent Number: 4,583,043
[45] Date of Patent: Apr. 15, 1986

[54] DETERMINATION OF ELECTRICAL ENERGY DIVERSION

[75] Inventor: Charles E. Phillips, Alhambra, Calif.

[73] Assignee: Southern California Edison Company, Inc., Rosemead, Calif.

[21] Appl. No.: 469,934

[22] Filed: Feb. 25, 1983

[51] Int. Cl.[4] .................................... G01R 19/10
[52] U.S. Cl. .................... 324/110; 324/127; 324/140 R
[58] Field of Search ........... 324/127, 110, 142, 129; 336/174; 324/140 R, 149; 361/78, 81; 307/7

[56] References Cited

U.S. PATENT DOCUMENTS

| | | | |
|---|---|---|---|
| 1,640,554 | 8/1927 | Peters | 324/127 |
| 1,800,474 | 4/1931 | Scherer | 324/127 |
| 2,323,996 | 7/1943 | Hubbard | 324/127 |
| 2,398,648 | 4/1946 | Kennedy | 361/67 X |
| 2,456,541 | 12/1948 | Stoecklin | 361/67 |
| 2,958,810 | 11/1960 | Balf | 324/73 R |
| 3,051,899 | 8/1962 | Wald | 324/127 |
| 3,253,215 | 5/1966 | Moakler et al. | 324/127 |
| 3,340,472 | 9/1967 | Schweitzer | 324/127 |
| 3,500,194 | 3/1970 | Smith | 324/110 |
| 3,611,136 | 10/1971 | Ito | 324/127 |
| 4,100,488 | 7/1978 | Quietzsch et al. | 324/127 |
| 4,110,683 | 8/1978 | Cason et al. | 324/52 |
| 4,331,915 | 5/1982 | Fielden | 324/110 |

FOREIGN PATENT DOCUMENTS

| | | | |
|---|---|---|---|
| 373742 | 6/1921 | Fed. Rep. of Germany | 324/110 |
| 37067 | 5/1977 | France | 324/149 |

OTHER PUBLICATIONS

Williams, J., "Stopping Power Meters", 2nd Ed., 1977.

Primary Examiner—Stewart J. Levy
Assistant Examiner—Stephen M. Baker
Attorney, Agent, or Firm—Lyon & Lyon

[57] ABSTRACT

An electrical energy diversion measurement device includes a first clip-on transformer for location about the power cable at high elevation in the zone of the weather guard or at underground manhole location where power supply enters the consumer's dwelling. A second clip-on transformer is simultaneously located about a cable passing through the watt power meter housing supplying power to the consumer. A digital measurement means is responsive to the current sensed by either the current transformers or simultaneously by the transformers and digitally displays the current of each or the difference between the sensed current as a representation of current difference and energy diversion.

16 Claims, 3 Drawing Figures

U.S. Patent   Apr. 15, 1986   4,583,043
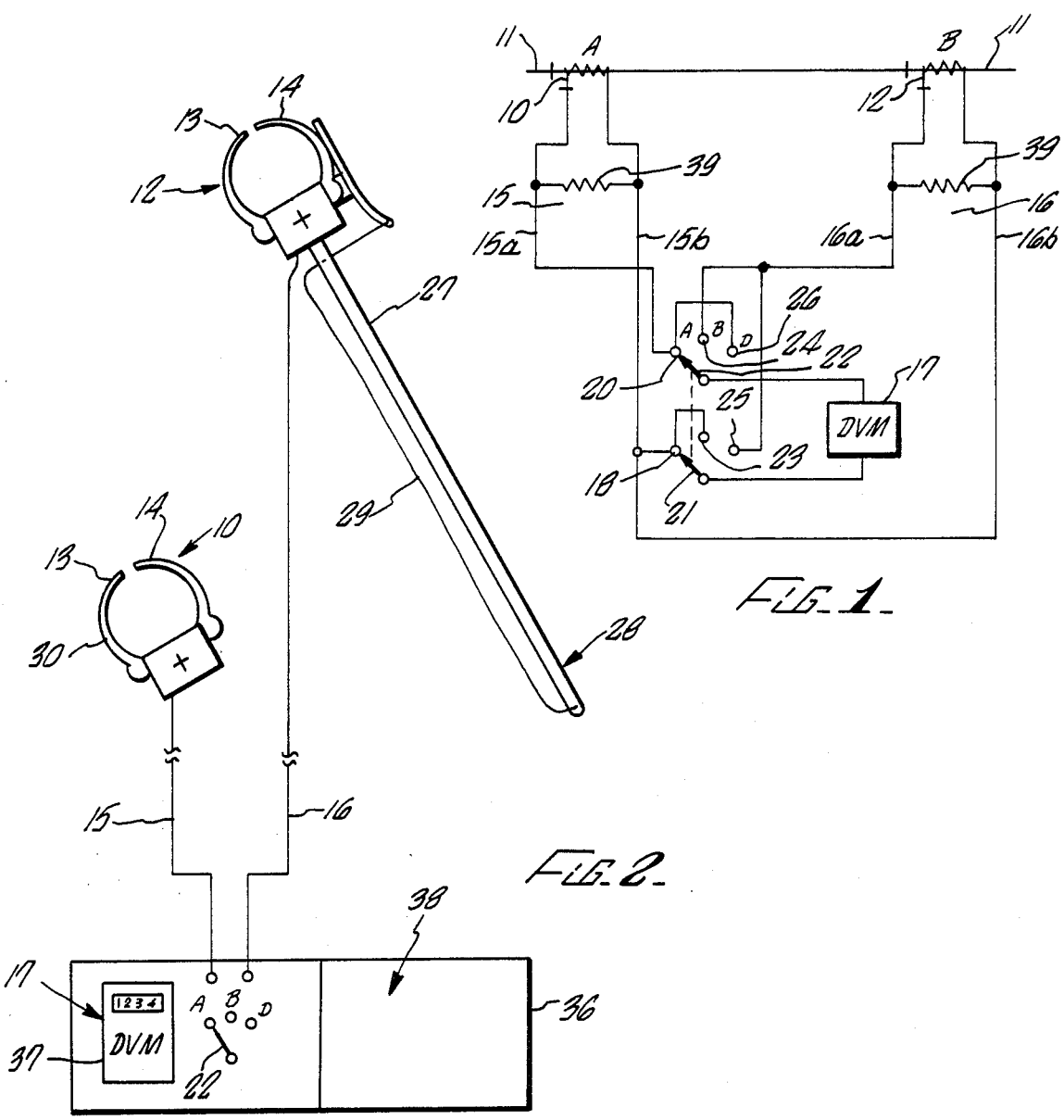
Fig. 1.
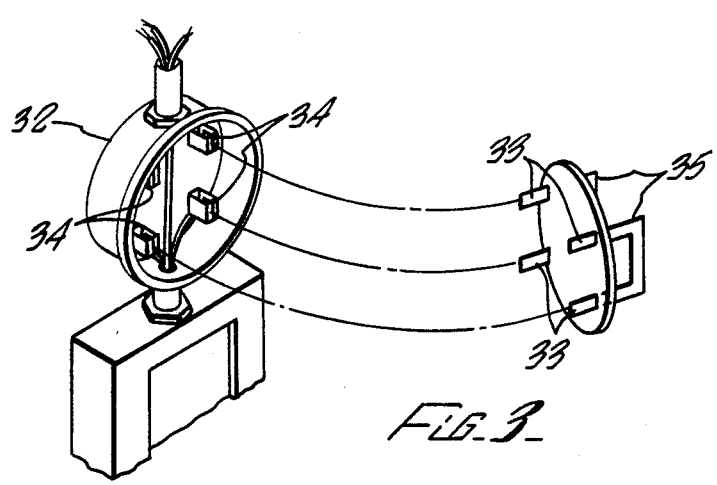
Fig. 2.
Fig. 3.

DETERMINATION OF ELECTRICAL ENERGY DIVERSION

RELATED APPLICATION

This application relates to the application being filed simultaneously herewith under the title "Electrical Energy Diversion Metering", Ser. No. 469,934, 2-25-83, and the contents therein are incorporated by reference herein.

BACKGROUND OF THE INVENTION

This invention relates to a device and system for determining electrical energy diversion. In particular, the invention is for a device to detect the unauthorized connection of load to the power line supply from a utility to a consumer, ahead of the watt-hour meter.

Tampering with the supply of electrical power from a utility to a consumer is becoming an increasing problem. One manner of electricity theft in this fashion is for the consumer to tap off power from the power lines from the utility at a point ahead of the location of the watt-hour meter. Such tapped off power can be led by the consumer to operate air conditioners, swimming pool pumps and similar apparatus. Often such consumers incorporate a switch in the tapped off line so that when they suspect or are aware of a meter reader's visit to the home, such switch is used to isolate the illegally connected apparatus. Thus, if forewarned, the consumer usually has a simple facility for covering over his illegal use of electricity.

There is accordingly a need to have an electrical energy diversion detection device which relatively unsuspectingly and quickly can be located in position and used to detect illegally consumed electricity. Thereby the ease for the consumer to hide his illegal use is minimized. The applicant is unaware of any such device which is currently available.

SUMMARY OF THE INVENTION

There is provided an electrical energy diversion measurement device which comprises a first clip-on current transformer means for connection in relationship about an inlet power cable from the electric utility. There is also a second clip-on current transformer means for connection in relationship about an inlet power supply to the consumer. Current measuring means, preferably digital, is responsive to the current sensed simultaneously by both current transformer means thereby to obtain a differential measurement of energy which is displayed, preferably digitally, through the measuring means.

Where needed an adaptor is provided to replace a watt-hour meter in its housing, and the inlet power supply is provided through the adaptor by locating the clip-on transformer about a conductor in the adaptor means. The second clip-on transformer is located about the same current line coming from the utility distribution system to the consumer, in a relatively high zone near the weatherguard to the inlet power supply to the consumer's habitat, or as an alternate in a manhole where the inlet power supply is underground. Such clip-on transformer is mounted at the end of an extension pole to facilitate its use and there are mechanical connection means between the current transformer and the remote end of the pole that facilitates remotely opening and closing the jaws of the current transformer means.

BRIEF DESCRIPTION OF THE DRAWINGS

FIG. 1 is a schematic illustrating an energy diversion measurement device about the power cable and power supply to the consumer which is a line on the same current side.

FIG. 2 is a diagramatic view illustrating the box within which the measurement device will be contained, and also the two current transformers.

FIG. 3 is a perspective view illustrating a watt-hour meter housing with an adaptor for location in the meter housing.

DESCRIPTION OF THE PREFERRED EMBODIMENT

An electrical energy diversion measurement device includes a first clip-on current transformer means 10 for operative connection in relationship about an inlet power cable 11 from the electric utility. There is also a second clip-on current transformer means 12 for operative connection in relationship about an inlet power supply to the consumer. The power cable is constituted by the same inlet line power cable 11. The second line of the power supply is not illustrated.

The current transformers 10 and 12 are constituted by spring type devices with jaws 13 and 14 which are adapted under the biasing spring action to close together about the cable 11 passing through the encircling jaws 13 and 14. In this fashion, the current transformers 10 and 12 obtain current readings of the cable 11. The current transformers 10 and 12 are connected through a conductor means 15 and 16 respectively to a box containing digital measuring means 17. Each of the conductor means 15 and 16 are constituted by two lines 15A and 15B respectively and 16A and 16B respectively. Lines 15A and 16A lead to terminal 18 of switch means 19, and lines 15B and 16B lead to terminal 20 of the switch means 19.

The switch means 19 includes a double ganged switching element 21 which is rotatable for connection respectively with terminals 18 and 20 in a first position, terminals 23 and 24 in a second position, and terminals 25 and 26 in a third position.

In the second position indicated by terminals 23 and 24, the current transformer 12 is connected across the digital means through the lines 16A and 16B. This is indicated by letter B which is indicative of the B position of the arm 22 and the B position reflecting the second current transformer 12. Connection with terminals 18 and 20, of lines 15A and 15B connects the first transformer 10 across the digital means 17. This is indicated by numeral A for the current transformer 10 and the numeral A of the switch.

In the third position of the switch arm 22, the lines 15B and 16B are connected across the digital measurement means 17 and in this position, the differential between the current sensed by transformer 10 and by transformer 12 is obtained as a response on the digital measurement means 17.

The current transformer 12 is mounted at the end of an extension pole 27 whereby a operator can use the pole by gripping the remote handle section 28 and applying the current transformer 12 at a relatively high elevation. Line means 29 is fixed between the end 28 of the pole 27 and a mounting means for the jaw means 13 and 14 of the current transformer 12. This mechanism is attached to jaw member 14 to affect remote opening and closing of the jaw means by the operator.

Also included in a kit which is a part of the electricity energy diversion measurement device of the invention is an adaptor 31 arranged for location in the watt-hour meter housing 32. The adaptor includes pins 33 for mounting in the sockets 34 of the housing. The pins 33 permit a continuing connection between appropriate mating sockets 34 so that electricity is supplied continually to the consumer while the diversion measurement device is in operation. Suitable insulation means 35 is located about conductors connected with the pins 33, and the current transformer 10 would be located about the conductor insulation 35 on the same current side as the transformer 12 is connected to the incoming cable to the consumer. This location about the insulated conductor is a connection about the inlet power supply. The insulated conductors constitute effective handles for locating and removing the adaptor 31 in relation to the housing 32.

In cases where older style metering is used, the current transformers can be placed directly about the conductors.

The diversion measurement device is contained in a box or housing 36 which on the one side mounts the electrical switch 19 and the digital measurement means 17 which is a digital voltmeter, with the display face 37 at the top of the box 36. A compartment 38 is provided on the other side of the box 36 for housing the current transformers 10 and 12 and, if appropriate, the pole 27 which could be of telescopic construction. In this manner, there is provided a convenient diversion testing kit.

The two clip on current transformers 10 and 12 are shunted by resistors 39 so that the outputs of lead 15 and 16 are voltages proportional to the primary current. These voltages are measured by the digital voltmeter measurement means 17. The input impedance to the measuring means is relatively high so that measuring means is not affected by any reasonable lead resistance. Accordingly, plug in leads of varying length may be used with no effect upon accuracy.

In use, when a utility supplier suspects the diversion of electrical energy, a testman or meter reader would be dispatched to the consumer to measure for this. When the utility requires an instantaneous reading of whether or not there is electricity diversion, the adaptor 31 would be inserted in place of the watt-hour meter and the current transformer 10 would be located around the one carrying line 35 on the adaptor. The second current transformer 12 would be extended to be located in a relationship about the same current line 11 in the zone of the weather guard for line from the distribution pole. This would be the inlet supply lines to the consumer.

By turning the switch 19 to position A, the current in current transformer 10 is indicated on the meter, and by turning the switch 19 to position B, the current in current transformer 12 is indicated on the meter.

By turning the switch 19 so that the arm 22 is in the position D, namely making contact with terminal 25 and 26 a measurement is obtained of the simultaneous and instantaneous indication of any differential in current the lines surrounded by the transformers 10 and 12. The digital measuring means 37 thereby generates a digital display indicating a representation of the extent of energy diversion if this is existant. In the application of the current transformers 10 and 12 are located in bucking relationship relative to each other such that inaccuracies in the clip-on transformers, which by nature are relatively inaccurate devices, cancel each other. In this fashion, the readings obtained from both transformers are of enhanced accuracy.

A further advantage of the invention is that it permits the application of inexpensive clip-on current transformers which, in bucking relationship, overcome inaccuracies of these transformers and thereby facilitate accurate determination of energy diversion. This differential or bucking feature also allows a steady-state reading even with fluctuating currents. Further only a single meter need be read even although there are two currents being measured, since they are bucking and only the differential, which may be zero, is needed to ascertain whether there is energy diversion.

A most significant advantage to the invention is that a single person can connect both current transformers and meter measurements at a single location. When the device is used in the differential mode of operation fluctuations in load do not affect the readings since only differential current readings are indicated on the meter.

In another embodiment of the invention the current measuring means 17 can be an analog device, and by the indication, for example, of a needle, the indication of energy diversion is obtained.

This device and method of this invention can be employed to measure energy division in single and polyphase systems.

While preferred embodiments of the invention have been described using specific terms, such description is for illustrative purposes only, and it is to be understood that changes and variations may be made without departing from the intent and scope of the following claims.

I claim:

1. An electrical energy diversion device comprising a first clip-on current transformer means for connection in relationship about an inlet power cable from electric utility, a second clip-on current transformer means for connection in relationship about an inlet power supply to the consumer, the current transformer means being substantially identical and current measurement means for recording the current sensed simultaneously by both the current transformer means thereby to obtain a measurement of the current passing through the inlet power cable and the inlet cable supply, the measurement means response being adapted to be disposed remotely from said transformer means, said display being a representation of the current difference measurement between the cable and supply, and wherein the first clip-on transformer means is for clipping about an inlet power cable from the utility distribution source to the consumer, and the second clip-on transformer means is for clipping about a power supply passing through a watt-hour meter housing, such power supply being provided by an adaptor element for replacing the watt-hour meter normally in the housing, and said adaptor element providing pin means for mounting with socket means in the watt-hour meter housing for a continuity of power supply to the consumer and conductor means for receiving the second clip-on transformer means.

2. The device as claimed in claim 1 wherein the clip-on transformer for location about the inlet power line is mounted on an extension pole whereby said transformer is locatable at the inlet power cable to the consumer substantially at a point of relatively removed location from a remote handle section of the extension pole.

3. The device as claimed in claim 2 including line means between the transformer means and the end of the pole remote from the transformer means, said line means permitting remote operation of the transformer by manual manipulation of the line means from a substantially lower elevation.

4. The device as claimed in claim 1 wherein the current transformer means are adapted for location about the cable and supply in bucking relationship relative to each other, thereby substantially to cancel inaccuracies in the transformer means and provide enhanced accuracy of the energy difference measurement.

5. The device as claimed in claim 4 wherein the measurement means includes a high impedance input.

6. The device as claimed in claim 1 wherein the measurement means includes switch means for permitting readings of current in each transformer means independently of the other.

7. The device as claimed in claim 1 wherein the current measurement device operates digitally and the display is digital.

8. The device as claimed in claim 5 wherein the current measurement device operates digitally and the display is digital.

9. An electrical energy diversion detection device comprising a first clip-on current transformer means for connection in relationship about an inlet power cable from an electric utility, a second clip-on current transformer means for connection in a relationship about an inlet power supply to the consumer, the current transformer means being substantially identical, digital measurement means disposed remotely from said transformer means and responsive to the current sensed simultaneously by both the current transformer means thereby to obtain a measurement of the energy passing through the cable and the supply, the measurement means being for response to the current readings of both the inlet power cable and the inlet power supply and for digitally displaying said response, adaptor means for replacing, in a watt-hour meter housing, a watt-hour meter normally positioned in said housing for maintaining a continuity of power to a consumer through the watt-hour meter housing, said adaptor element having pin means for mounting with socket means in the watt-hour meter housing, and the second current transformer means being for a relationship about the inlet power supply to the consumer through the adaptor means, and the first clip-on transformer means being for connection about the power inlet supply, said first clip-on transformer being mounted on an extension pole whereby the transformer means is locatable at a relatively high elevation about a watt-hour meter housing about an inlet supply to the consumer for power from a distribution source, while the transformer about the supply is for retention simultaneously at the adaptor means.

10. A method for determining electrical energy diversion comprising locating a first clip-on current transformer means in relationship about an inlet power cable from an electric utility, locating a second substantially identical clip-on current transformer means in location about an inlet power supply to the consumer, obtaining a measurement responsive to each of the currents simultaneously passing through the current transformer means thereby to obtain a measurement of the difference passing through the cable and the supply, displaying remotely said transformer means a representation of said difference, including replacing a watt-hour meter in a watt-hour meter socket with an adaptor including pin means for mounting with socket means in the watt-hour meter socket, and wherein the second clip-on transformer is located about a line in the adaptor, and the first clip-on transformer is located about the same current line of the power cable to the consumer.

11. A method as claimed in claim 10 wherein the measurement is digitally obtained and the representation is digitally displayed.

12. An electrical energy diversion detection device for temporary operation at a consumer operational site in substantially close proximity with the watt-hour meter housing comprising a first clip-on current transformer means for connection in relationship about an inlet power cable from electric utility, a second clip-on current transformer means for connection in relationship about an inlet power supply to the consumer, the current transformer means being substantially identical, and current measurement means for responding to the current sensed simultaneously by both the current transformer means thereby to obtain a measurement of the current difference passing through the inlet power cable and the inlet cable supply, the measurement means response being adapted to be displayed remotely to said transformer means and said display being a representation of the current difference measurement between the cable and supply, wherein the clip-on transformer for location about the inlet power line is mounted on an extension pole whereby said transformer is locatable at the inlet power cable to the consumer substantially at a point of relatively removed location from a remote handle section of the extension pole, line means between the transformer means and the end of the pole remote from the transformer means, said line means permitting remote operation of the transformer by manual manipulation of the line means from a substantially lower elevation, and a wired electrical connection means between the transformer means and measurement means.

13. The device as claimed in claim 12, wherein the current transformer means are adapted for location about the cable and supply in bucking relationship relative to each other, thereby substantially to cancel inaccuracies in the transformer means and provide enhanced accuracy of the energy difference measurement.

14. The device as claimed in claim 13, wherein the measurement means includes a high impedance input.

15. The device as claimed in either claim 12 or 13, wherein the measurement means includes switch means for permitting readings of current in each transformer means independently of the other.

16. The device as claimed in claim 12 or 13 wherein the current measurement device operates digitally and the display is digital.

* * * * *